United States Patent
Zhu et al.

(10) Patent No.: US 10,230,044 B2
(45) Date of Patent: Mar. 12, 2019

(54) FULLY COMPENSATED SYNTHETIC FERROMAGNET FOR SPINTRONICS APPLICATIONS

(71) Applicant: Headway Technologies, Inc., Milpitas, CA (US)

(72) Inventors: Jian Zhu, San Jose, CA (US); Guenole Jan, San Jose, CA (US); Yuan-Jen Lee, Fremont, CA (US); Huanlong Liu, Sunnyvale, CA (US); Ru-Ying Tong, Los Gatos, CA (US); Po-Kang Wang, Los Altos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/707,373

(22) Filed: Sep. 18, 2017

(65) Prior Publication Data

US 2018/0026179 A1 Jan. 25, 2018

Related U.S. Application Data

(62) Division of application No. 14/949,232, filed on Nov. 23, 2015, now Pat. No. 9,780,299.

(51) Int. Cl.
*H01L 43/02* (2006.01)
*H01L 43/08* (2006.01)
(Continued)

(52) U.S. Cl.
CPC .......... *H01L 43/08* (2013.01); *G11C 11/161* (2013.01); *H01F 10/16* (2013.01); *H01F 10/30* (2013.01);
(Continued)

(58) Field of Classification Search
CPC .......... H01L 43/02; H01L 43/08; H01L 43/10
See application file for complete search history.

(56) References Cited

U.S. PATENT DOCUMENTS

| 6,205,052 B1 | 3/2001 | Slaughter et al. |
| 6,612,018 B1 | 9/2003 | Gill |

(Continued)

FOREIGN PATENT DOCUMENTS

| JP | 2008 124486 | 5/2008 |
| JP | 2011 138954 | 7/2011 |

(Continued)

OTHER PUBLICATIONS

"Current-induced magnetization reversal in nanopillars with perpendicular anisotropy," by S. Mangin, et al., 2006 Nature Publishing Group, nature materials, vol. 5, Mar. 2006, www.nature.com/naturematerials, pp. 210-215.

(Continued)

*Primary Examiner* — Trang Q Tran
(74) *Attorney, Agent, or Firm* — Saile Ackerman LLC; Stephen B. Ackerman

(57) ABSTRACT

A laminated seed layer stack with a smooth top surface having a peak to peak roughness of 0.5 nm is formed by sequentially sputter depositing a first seed layer, a first amorphous layer, a second seed layer, and a second amorphous layer where each seed layer may be Mg and has a resputtering rate 2 to 30× that of the amorphous layers that are TaN, SiN, or a CoFeM alloy. A template layer that is NiCr or NiFeCr is formed on the second amorphous layer. As a result, perpendicular magnetic anisotropy in an overlying magnetic layer that is a reference layer, free layer, or dipole layer is substantially maintained during high temperature processing up to 400° C. and is advantageous for magnetic tunnel junctions in embedded MRAMs, spintronic (Continued)

devices, or in read head sensors. The laminated seed layer stack may include a bottommost Ta or TaN buffer layer.

8 Claims, 5 Drawing Sheets

(51) Int. Cl.
    *G11C 11/16*     (2006.01)
    *H01L 43/10*     (2006.01)
    *H01L 43/12*     (2006.01)
    *H01F 10/16*     (2006.01)
    *H01F 10/30*     (2006.01)
    *H01F 10/32*     (2006.01)

(52) U.S. Cl.
    CPC ......... *H01F 10/32* (2013.01); *H01F 10/3286* (2013.01); *H01L 43/02* (2013.01); *H01L 43/10* (2013.01); *H01L 43/12* (2013.01); *H01F 10/3254* (2013.01)

(56) References Cited

U.S. PATENT DOCUMENTS

| | | | |
|---|---|---|---|
| 7,190,613 B2 | 3/2007 | Nagase et al. | |
| 7,276,384 B2 | 10/2007 | Parkin et al. | |
| 7,345,854 B2 | 3/2008 | Takano | |
| 7,839,605 B2 | 11/2010 | Parker | |
| 7,843,669 B2 | 11/2010 | Fukuzawa et al. | |
| 8,541,855 B2 | 9/2013 | Jan et al. | |
| 8,673,654 B2 | 3/2014 | Hong et al. | |
| 8,871,365 B2 | 10/2014 | Wang et al. | |
| 2004/0041183 A1* | 3/2004 | Slaughter | B82Y 10/00 257/295 |
| 2004/0087163 A1 | 5/2004 | Steimle et al. | |
| 2004/0184311 A1 | 9/2004 | Sharma | |
| 2006/0198063 A1 | 9/2006 | Fukuzawa et al. | |
| 2009/0213503 A1 | 8/2009 | Sun et al. | |
| 2009/0257151 A1 | 10/2009 | Zhang et al. | |
| 2010/0330395 A1 | 12/2010 | Zhang et al. | |
| 2011/0293967 A1 | 12/2011 | Zhang et al. | |
| 2012/0299134 A1 | 11/2012 | Jan et al. | |
| 2015/0340598 A1 | 11/2015 | Gan et al. | |

FOREIGN PATENT DOCUMENTS

WO    WO 2012/154411    11/2012
WO    WO 2017/165058    9/2017

OTHER PUBLICATIONS

"Microwave Assisted Magnetic Recording," by Jian-Gang Zhu, et al., IEEE Transactions on Magnetics, vol. 44, No. 1, Jan. 2008, pp. 125-131.

"Current-driven excitation of magnetic multilayers," by J.C. Slonczewski, Journal of Magnetism and Magnetic Materials, 159 (1996) L1-L7, Jun. 1996.

"Perpendicular Magnetic Anisotropy in CoFeB/Pd Bilayers," by Ciaran Fowley, et al., IEEE Transactions on Magnetics, vol. 46, No. 6, Jun. 2010, pp. 2116-2118.

"Realization of CoFeB/MgO/CoFeB Magnetic Tunnel Junction Devices Through Materials Analysis, Process Integration and Circuit Simulation," by Sankha Subhra Mukherjee, a Dissertation submitted on Dec. 2009, Rochester Institute of Technology, 190 pgs.

"Spin-torque driven ferromagnetic resonance of Co/Ni synthetic layers in spin valves," by W. Chen et al., Applied Physics Letters 92, 012507, Jan. 4, 2008, pp. 1-3.

"Magnetic anisotropies in Co/Ni(111) multilayers," by P.J.H. Bloemen et al., Journal of Applied Physics, vol. 72, No. 10, Nov. 15, 1992, pp. 4840-4844.

"Spin transfer switching in TbCoFe/CoFeB/MgO/CoFeB/TbCoFe magnetic tunnel junctions with perpendicular magnetic anisotropy," by Masahiko Nakayama et al., Journal of Applice Physics, 103, 07A710, Apr. 2008, pp. 1-3.

Bond Dissociation Energies, by Yu-Ran Luo, Feb. 23, 2010, 34 pgs, found: https://notendur.hi.is/agust/rannsoknir/papers/2010-91-CRC-BDEs-Tables.pdf.

PCT Search Report, Application No. PCT/US2012/035104, Applicant: Magic Technologies, Inc., dated Aug. 6, 2012, 13 pgs.

PCT Search Report, Application No. PCT/US2016/058449, Applicant: Magic Technologies, Inc., dated Feb. 6, 2017, 15 pgs.

PCT Search Report, International Application No. PCT/US2018/032637, Applicant: Headway Technologies, Inc., dated Aug. 28, 2018, 14 pgs.

* cited by examiner

FULLY COMPENSATED SYNTHETIC FERROMAGNET FOR SPINTRONICS APPLICATIONS This is a Divisional application of U.S. patent application Ser. No. 14/949,232, filed on Nov. 23, 2015, which is herein incorporated by reference in its entirety, and assigned to a common assignee.

RELATED PATENT APPLICATIONS

This application is related to the following: U.S. Pat. No. 8,541,855 and U.S. Pat. No. 8,871,365; both assigned to a common assignee and herein incorporated by reference in their entirety.

TECHNICAL FIELD

The present disclosure relates to magnetic devices that utilize thin films with perpendicular magnetic anisotropy (PMA), and in particular, to the use of a multilayer stack for the seed layer to increase thermal stability in the resulting magnetic tunnel junction (MTJ) found in embedded MRAM devices that are subjected to high temperature semiconductor processes up to about 400° C.

BACKGROUND

Magnetoresistive Random Access Memory (MRAM) has a read function based on a tunneling magnetoresistive (TMR) effect in a MTJ stack wherein a tunnel barrier is formed between a free layer and a reference layer. The free layer serves as a sensing layer by switching the direction of its magnetic moment in response to external fields (media field) while the reference layer has a fixed magnetic moment. The electrical resistance through the tunnel barrier (insulator layer) varies with the relative orientation of the free layer moment compared with the reference layer moment and thereby provides an electrical signal that is representative of the magnetic state in the free layer. In MRAM, the MTJ is formed between a top conductor (electrode) and bottom conductor. When a current is passed through the MTJ, a lower resistance is detected when the magnetization directions of the free and reference layers are parallel ("0" memory state), and a higher resistance is noted when they are anti-parallel ("1" memory state). The TMR ratio is dR/R where R is the minimum resistance of the MTJ, and dR is the difference between the lower and higher resistance values. The tunnel barrier is typically about 10 Angstroms thick so that a current through the tunnel barrier can be established by a quantum mechanical tunneling of conduction electrons.

Another version of MRAM that relies on a TMR effect, and is referred to as a spintronic device that involves spin polarized current, is called spin-transfer torque (STT) MRAM and is described by C. Slonczewski in "Current driven excitation of magnetic multilayers", J. Magn. Magn. Mater. V 159, L1-L7 (1996). J-G. Zhu et al. has described another spintronic device called a spin transfer oscillator (STO) in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry.

MTJ elements wherein one or both of the free layer and reference layer have perpendicular magnetic anisotropy (PMA) are preferred over their counterparts that employ in-plane anisotropy because the former has an advantage in a lower writing current for the same thermal stability, and better scalability for higher packing density which is one of the key challenges for future MRAM applications. In MTJs with PMA, the free layer has two preferred magnetization orientations that are perpendicular to the physical plane of the layer. Without external influence, the magnetization or magnetic moment of the free layer will align to one of the preferred two directions, representing information "1" or "0" in the binary system. For memory applications, the free layer magnetization direction is expected to be maintained during a read operation and idle, but change to the opposite direction during a write operation if the new information to store differs from its current memory state. The ability to maintain free layer magnetization direction during an idle period is called data retention or thermal stability. The level of stability required is usually related to the memory application. A typical non-volatile memory device may require thermal stability at 125° C. for about 10 years.

Moreover, for MRAM devices that are often embedded in Complementary Silicon Oxide Semiconductor (CMOS) chips, the MTJ must be able to withstand high temperature processing conditions up to about 400° C. that are commonly applied during the deposition of low-k dielectric films for transistors in CMOS structures. In most cases, this temperature exceeds the optimum temperature for best magnetic performance in the MTJ or MRAM. MTJs are usually annealed in the 300-330° C. degree range to obtain the desired magnetic properties.

As a result of 400° C. processing, free layer PMA is typically reduced and thermal stability is less compared with a condition where the MTJ is annealed only to 330° C., for example. Free layer coercivity is also less after high temperature processing to around 400° C. than after 300-330° C. annealing. However, it is an important requirement to maintain coercivity after high temperature processing.

Thus, there is a significant challenge to maintain PMA and enhance thermal stability of reference and free layers to improve the performance of MTJs at elevated temperatures typical of back end of line (BEOL) semiconductor processes. Current MTJ structures fail to satisfy the performance requirements for advanced embedded MRAM devices. Therefore, an improved MTJ stack is needed to enable a magnetic layer with thermal stability to at least 400° C., and where PMA is maintained in the reference layer and free layer.

SUMMARY

One objective of the present disclosure is to provide a multilayer MTJ stack in a magnetic device wherein PMA in the magnetic layer adjoining the seed layer is maintained or enhanced after high temperature processing of about 400° C. for at least 30 minutes.

A second objective of the present disclosure is to provide a method of forming the MTJ stack that satisfies the first objective.

According to one embodiment of the present disclosure, these objectives are achieved by configuring a MTJ stack with a seed layer, reference layer (RL), tunnel barrier, and free layer (FL) in a seed layer/RL/tunnel barrier/FL bottom spin valve configuration. A key feature is the multilayer stack that is selected for the seed layer. In one embodiment, the seed layer is a stack of four layers wherein a bottommost layer such as Ta or TaN is employed for good adhesion to a substrate or a bottom electrode. A second seed layer contacts a top surface of the bottommost layer and is selected because of a high resputtering rate property. The second layer is preferably one of Mg, Al, Si, C, B, Mn, Rb, Zn, and Ti and typically has a substantially uneven top surface after deposition. Next, a third seed layer that is an amorphous material with a lower resputtering rate than the second layer is formed on the second layer. During the third layer deposition, a portion of the second layer top surface is removed due to a high resputter rate and is replaced by a third layer with less roughness (better peak to peak uniformity) in its top surface. As a result, each of the second and third seed layers has a smooth top surface with reduced roughness and the combination thereof is called a "smoothing layer". The stack of second and third seed layers may be repeated. The uppermost layer in the seed layer stack serves as a template layer for the overlying PMA layer. In other words, the uppermost layer is made of a material such as NiCr or NiFeCr having a (111) crystal orientation that promotes PMA in the overlying magnetic layer which may be a reference layer in a bottom spin valve structure or a free layer in a MTJ with a top spin valve design. Because of a smooth top surface on the amorphous third seed layer, the template layer also has a smooth top surface with peak to peak roughness≤0.5 nm over a range of 100 nm compared with a peak to peak roughness of about 2 nm over a range of 100 nm in prior art seed layer films as determined by transmission electron microscope (TEM) measurements.

In a bottom spin valve embodiment, the reference layer also known as a pinned layer in a synthetic antiparallel (SyAP) stack adjoins a top surface of the template layer and preferably has intrinsic PMA derived from a laminated stack represented by $(Co/X)_n$ where X is Pt, Pd, Ni, NiCo, Ni/Pt, or NiFe, and n is from 2 to 30. In another aspect, CoFe or CoFeR may replace Co in the laminated stack where R is one of Mo, Mg, Ta, W, or Cr. The smooth template layer formed on the smooth top surface of the amorphous layer is advantageously used to maintain or enhance PMA in the reference layer after high temperature processing up to about 400° C.

A tunnel barrier is formed on the reference layer. In an alternative embodiment, a transition layer such as CoFe/Co or CoFeB/Co is inserted between the reference layer and tunnel barrier. The tunnel barrier is preferably an oxide, nitride, or oxynitride of one or more of Mg, MgZn, Ta, Ti, Zn, Al, or AlTi.

A free layer/capping layer stack is formed on the tunnel barrier. The free layer may be selected from one of the laminated compositions described with respect to the reference layer. In an alternative embodiment, the free layer may be one or more of Co, Fe, CoFe, and alloys thereof with one or both of Ni and B. In another aspect, a moment diluting layer (L) such as Ta or Mg is inserted in one of the aforementioned metals or alloys to give a CoFeB/L/CoFeB configuration, for example. The capping layer may comprise a metal oxide such as MgO to enhance PMA in the free layer by generating perpendicular interfacial anisotropy at a free layer/metal oxide interface. Moreover, there may be an uppermost layer that is one or more of Ru and Ta to give a capping layer stack that is MgO/Ru/Ta or the like.

In a second embodiment, the MTJ layers and compositions thereof are retained from the first embodiment but are formed in a top spin valve design represented by a seed layer/free layer/tunnel barrier/reference layer/capping layer configuration. Here, the uppermost template layer in the seed layer stack adjoins a bottom surface of the free layer.

A third embodiment retains the bottom spin valve stack from the first embodiment and further includes a spacer/underlayer/PMA layer stack between the free layer and capping layer where the PMA layer serves as a dipole layer to reduce the offset of the minor switching loop of the free layer caused by a dipole field from the reference layer. The spacer may be Ta, and the PMA layer is preferably a multilayer stack such as $(Co/X)_n$ described previously. The underlayer is the multilayer seed stack described earlier in order to maintain PMA in the dipole layer following high temperature processing.

In the aforementioned embodiments, the buffer layer in the seed layer stack is optional. Thus, the present disclosure anticipates that the second seed layer having a high resputter rate may contact a top surface of the substrate or the bottom electrode. Moreover, the second and third seed layers may be repeated on the substrate to give a laminated structure before the uppermost (template) seed layer is deposited.

After all layers in the MTJ are laid down, an anneal process up to 400° C. for 30 minutes may be employed to further improve PMA properties and thereby increase Hc and Hk in the magnetic layers. Thereafter, a conventional process sequence is performed to fabricate a top electrode on the MTJ stack.

DETAILED DESCRIPTION

The present disclosure is a MTJ wherein at least one of a free layer, reference layer, or dipole layer has perpendicular magnetic anisotropy that is maintained during 400° C. processing in magnetic devices such as embedded MRAM and STT-MRAM, in spintronic devices such as microwave assisted magnetic recording (MAMR) and spin torque oscillators (STO), and in various spin valve designs including those found in read head sensors. PMA is maintained by depositing the magnetic layer on a seed layer stack wherein an uppermost template layer has an unusually smooth top surface made possible by deposition of the template layer on a smoothing layer comprised of a lower seed layer with high resputtering rate and an upper amorphous layer with a low resputtering rate as described herein. The seed layer stack may be used in devices based on bottom spin valve, top spin valve, or dual spin valve designs as appreciated by those skilled in the art.

Figure 1:
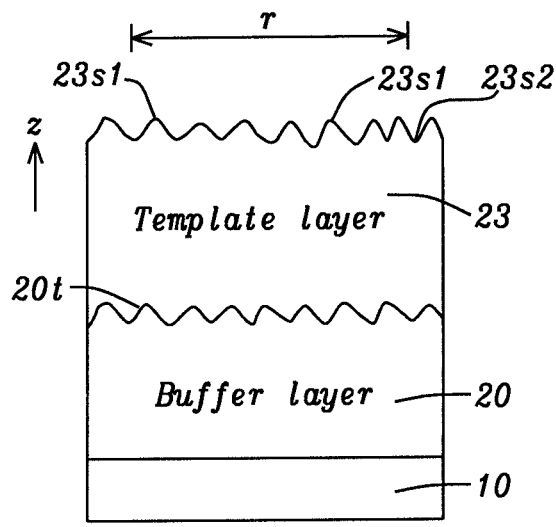
FIG. 1 is a cross-sectional view of a seed layer stack in the prior art where a rough top surface in the bottom buffer layer is reproduced in the upper template layer.

Referring to FIG. 1, a cross-sectional view is shown of a seed layer stack formerly fabricated by the inventors. The seed layer is formed on a substrate such as a bottom electrode 10 in a MRAM device, and has a bottom layer called a buffer layer 20 that is used for good adhesion to the substrate. Ta or TaN are commonly selected for the buffer layer, which tends to have considerable roughness at its top surface 20$t$. An upper template layer 23 made of NiCr, NiFeCr, or the like is conformally deposited on the buffer layer, and has a (111) crystal structure in order to promote a fcc (111) crystal orientation in an overlying $(Co/X)_n$ multilayer. As a result, the significant roughness in top surface 20$t$ is essentially duplicated in the top surface of the template layer where peaks 23$s$1 are separated by valleys 23$s$2 in the film. The substantial peak to peak roughness in the template layer top surface is associated with a loss in PMA in an overlying magnetic layer (not shown) such as a reference layer, free layer, or dipole layer during high temperature processing. Peak to peak roughness is defined as the average difference in the z-axis direction between peaks 23$s$1 and is about 2 nm over a range r of 100 nm.

Previously, we described in related U.S. Pat. No. 8,871,365 how thermal stability in a reference layer and free layer may be improved with a RL1/DL1/Ru/DL2/RL2 or FL1/DL1/Ru/DL2/FL2 configuration, respectively, where R1 and R2 (or FL1 and FL2) are two magnetic layers with PMA that are antiferromagnetically coupled through a middle Ru layer. Dusting layers (DL1 and DL2) such as Co or CoFe are responsible for enhancing thermal stability compared with a RL or FL having a R1/Ru/R2, or FL1/Ru/FL2 stack, respectively.

We also disclosed in related U.S. Pat. No. 8,541,855 how a Hf/NiCr or Hf/NiFeCr seed layer improves PMA in an overlying $(Co/Ni)_n$ multilayer. Now we have discovered that PMA in a $(Co/Ni)_n$ laminate or the like may be maintained during high temperature processing to about 400° C. by a stack of seed layers which promote a more uniform top surface on the uppermost template layer. In this context, the term "about 400° C." means the temperature may exceed 400° C. by 10-20° C. for a certain period of time due to temperature fluctuations or excursions in the chamber where an annealing or deposition process is performed.

Figure 2:
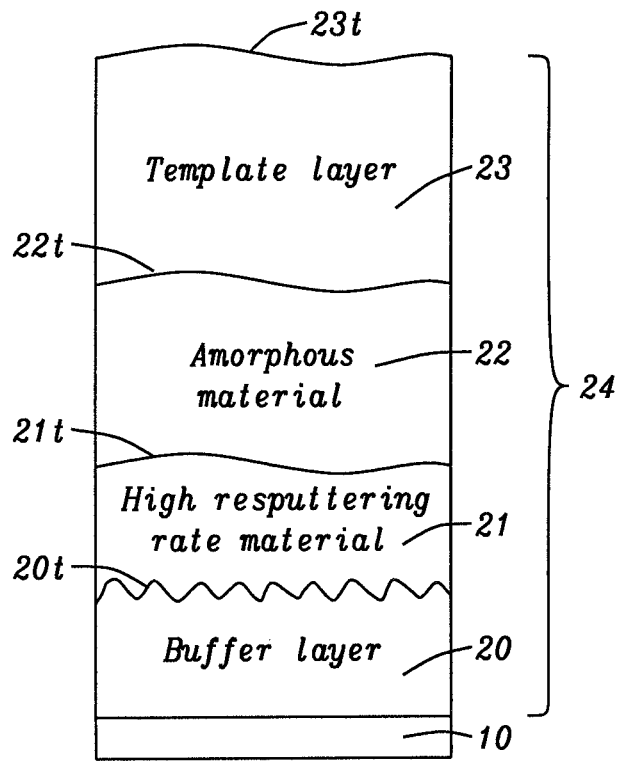
FIG. 2 is a cross-sectional view of the seed layer stack with four layers formed according to an embodiment of the present disclosure.

According to a first embodiment depicted in FIG. 2, the seed layer stack 24 of the present disclosure includes a bottom layer 20 and an uppermost template layer 23 as previously described. However, a key feature is a so-called "smoothing layer" structure having a stack of layers 21/22 where second layer 21 is made of a material with a high resputtering rate that is formed on a top surface 20$t$ of the bottommost layer. Layer 21 preferably is one or more of Mg, Al, Si, C, B, Mn, Rb, Zn, and Ti with a thickness from 3 to 100 Angstroms, and preferably 3 to 20 Angstroms. Non-crystalline or nano-crystalline (grain size<5 nm) layer 22 is made of TaN, SiN, or CoFeM where M is one of B, P, Ta, Zr, Si, Cu, Hf, Mo, W, and Nb with an M content that results in amorphous character for the CoFeM alloy. Preferably, the CoFeM alloy is amorphous as deposited. Layer 22 has a thickness from 1 to 100 Angstroms, and preferably 2 to 15 Angstroms, and has a lower resputtering rate than second layer 21 such that layer 21 has a resputtering rate from 2 to 30 times that of layer 22.

As defined herein, resputtering rate is related in part to bond energy, which is the energy needed to break apart bonded atoms. Therefore, a material with a low bond energy is easy to resputter and has a higher resputtering rate than a material with a higher bond energy. For example, the bond energy of Mg—Mg is 11.3 kJ/mol while the bond energy of Fe—Fe is 118 kJ/mol and of Co—Co is about 127 kJ/mol according to a table of values found in "Comprehensive Handbook of Chemical Bond Energies", Y. Luo, CRC Press, Boca Raton, Fla., 2007. It follows that the bond energy ratio between Mg and CoFe (or CoFeB) is about 1:10 to give a resputtering rate for Mg that is about 10 times greater than that for CoFe. Thus, the material in layer 21 has a first bond energy that is less than a second bond energy for the material in layer 22.

A second important factor in determining resputtering rate is the atomic number (Z) of an element. In particular, materials in layer 21 are more easily displaced during deposition of layer 22 when the material for the non-crystalline or nano-crystalline layer has a higher weight (larger Z value) than the element or alloy selected for layer 21. Accordingly, a greater resputtering rate ratio (layer 21/layer 22) is achieved with a condition where layer 21 is an element or alloy with both of a lower Z value and smaller bond energy than the material in layer 22.

Figure 7:
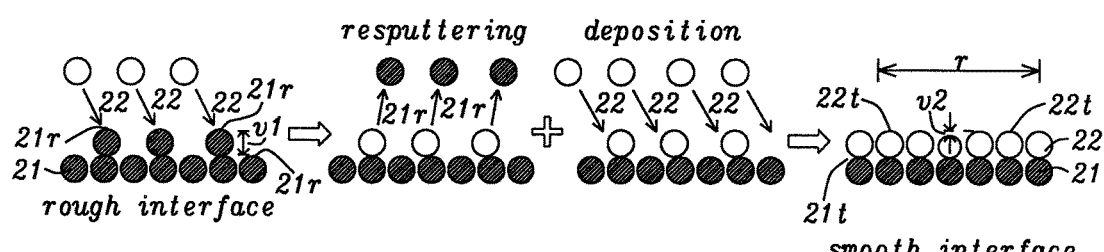
FIG. 7 depicts a process of sputter depositing an amorphous seed layer on a seed layer with a higher resputtering rate according to an embodiment of the present disclosure.

As a result of the resputtering rate (bond energy) difference, when the non-crystalline or nano-crystalline material is deposited as depicted in the deposition sequence found in FIG. 7, atoms of second layer 21 are displaced from a top surface of the second seed layer and are replaced by a more uniform film of layer 22. In other words, an "as deposited" top surface 21$r$ of the second layer with a peak to peak roughness v1 becomes a smooth top surface 21$t$ with substantially less roughness as layer 22 is deposited thereon. Peak to peak roughness v2 between peaks 22$t$ has been observed to be only 0.5 nm over a 100 nm range r, and is substantially less than a peak to peak roughness v1 of about 2 nm over a 100 nm range for top surface 21$r$ prior to deposition of layer 22.

Returning to FIG. 2, top surfaces 21$t$, 22$t$ of layers 21 and 22, respectively are shown with a relatively smooth profile compared with the uneven (rough) top surface 20$t$ of the bottom seed layer 20. Furthermore, the smooth top surface 22$t$ is essentially reproduced in top surface 23$t$ of the uppermost template layer 23 that typically conforms to the top surface of the underlying layer. As stated previously, the term "smooth" when referring to a top surface 23$t$ may be described in terms of a peak to peak roughness over a range of 100 nm. In this case, a TEM measurement indicates a peak to peak roughness in top surface 23$t$ of about 0.5 nm, which represents a substantial improvement over the 2 nm value for peak to peak roughness for peaks 23$s$1 of the template layer in the FIG. 1 reference.

Figure 3A:
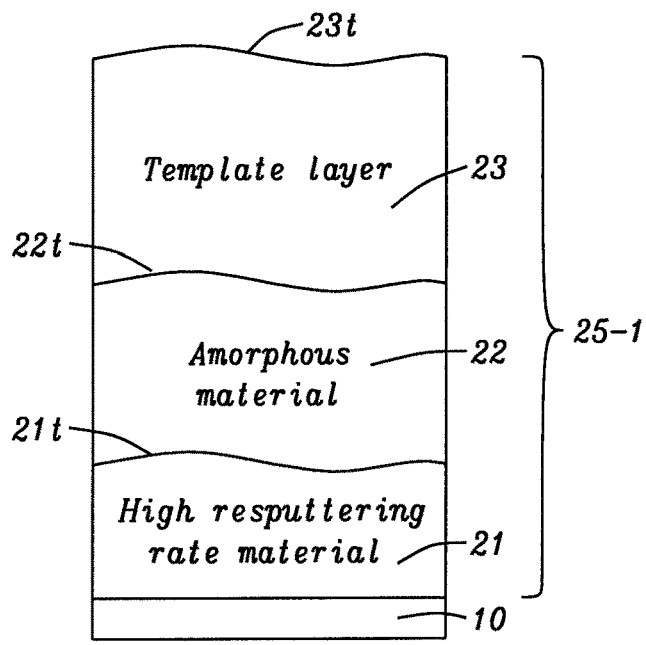
FIG. 3a is a cross-sectional view of the seed layer stack in FIG. 2 wherein the bottommost buffer layer is omitted according to a second embodiment of the present disclosure.

In a second embodiment illustrated in FIG. 3$a$, bottom layer 20 may be omitted to provide a seed layer stack 25-1 where the high resputtering rate layer 21 contacts a top surface of the substrate 10. As a result of depositing the non-crystalline or nano-crystalline layer 22, both seed layers in the smoothing layer stack have smooth top surfaces 21$t$, 22$t$ similar to that found for the template layer as described previously for the first embodiment. Thus, the seed layer stack 25-1 is a trilayer with a 21/22/23 configuration where template layer 23 has a top surface 23$t$ and a peak to peak roughness v2 that is attributed to maintaining PMA in an overlying magnetic layer after processing at temperatures as high as 400° C. as supported by data provided in a later section.

Figure 3B:
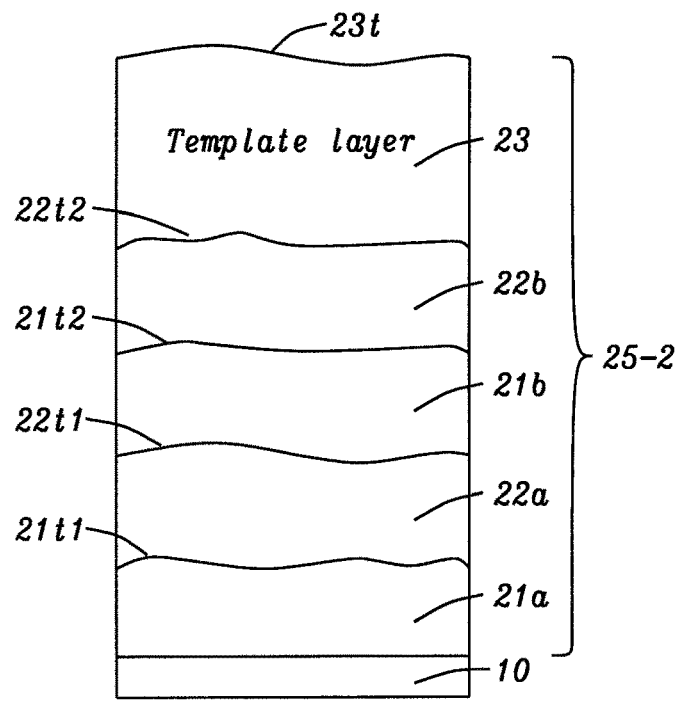
FIG. 3b is a cross-sectional view of a seed layer stack wherein the high resputtering rate and low resputtering rate (amorphous) layers are repeated according to another embodiment of the present disclosure.

The present disclosure also anticipates the smoothing layer stack 21/22 may be repeated to give a laminate consisting of alternating layers 21 and 22. A third embodiment is depicted in FIG. 3b where a first high resputtering rate layer 21a is formed on the substrate 10. Above layer 21a is formed sequentially a first low resputtering rate layer 22a, a second high resputtering rate layer 21b, and a second low resputtering rate layer 22b, and a template layer 23 to give a 21a/22a/21b/22b/23 configuration for seed layer stack 25-2. The bond energy for the material in layers 21a, 21b is less than that of the material in layers 22a, 22b. In some embodiments, layers 21a, 21b may be made of the same element or alloy, and layers 22a, 22b are selected from the same material. However, the present disclosure anticipates that layer 21a may have a different composition than layer 21b, and layer 22a may have a different composition than layer 22b.

It is believed that the third embodiment provides a further improvement in top surface 23t uniformity compared with the previous embodiments. In this seed layer design, each high resputtering rate layer preferably has a thickness from 3 to 20 Angstroms, and each low resputtering rate layer 22a, 22b with amorphous character preferably has a thickness of 2 to 15 Angstroms. It should be understood that the seed layer structure in the first embodiment may be modified accordingly to insert the aforementioned laminated smoothing layer instead of one of each layer 21, 22 between layers 20 and 23 in stack 24. Moreover, there may be more than one repeat of layers 21, 22 in a smoothing layer stack.

The present disclosure also encompasses a magnetic tunnel junction (MTJ) element comprising a seed layer stack formed according to one of the embodiments described herein. In the exemplary embodiments, a bottom spin valve and top spin valve are depicted. However, the seed layer embodiments described herein may be implemented in other spin valve designs including a dual spin valve structure as appreciated by those skilled in the art.

Figure 4:
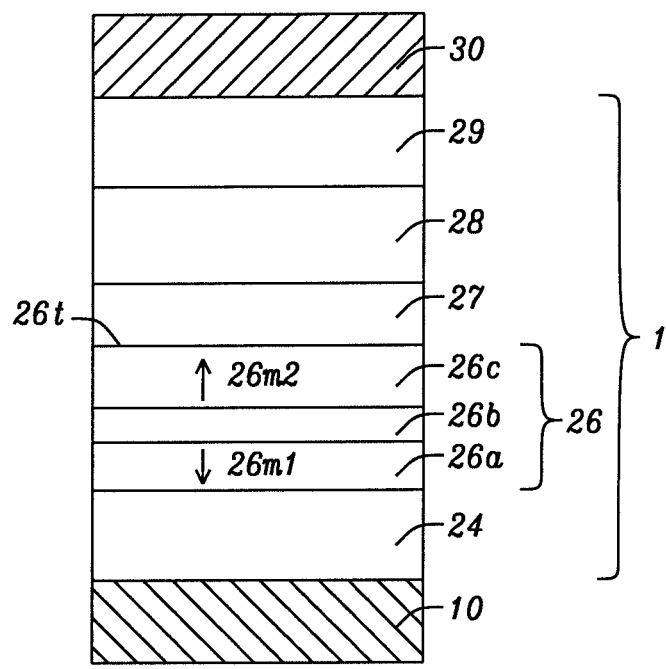
FIG. 4 is a cross-sectional view of a magnetic tunnel junction (MTJ) with a bottom spin valve configuration, and containing a seed layer stack formed according to an embodiment of the present disclosure.

Referring to FIG. 4, MTJ 1 is formed between a substrate 10 that may be a bottom electrode, and a top electrode 30. A bottom spin valve configuration is shown wherein the seed layer stack 24, a reference layer 26, tunnel barrier 27, free layer 28, and capping layer 29 are sequentially formed on the substrate. In one preferred embodiment, the reference layer (RL) has a synthetic antiparallel (SyAP) stack with an AP2 layer 26a contacting a top surface of the seed layer, a middle coupling layer 26b such as Ru, and an uppermost AP1 layer 26c. Preferably, both of the AP2 and AP1 layers have PMA such that magnetization 26m1, 26m2, respectively, are aligned in a direction perpendicular to the planes of the MTJ layers. PMA in each of the AP2 and AP1 layers may be intrinsic and derived from a laminated stack (Co/X)$_n$ where X is Pt, Pd, Ni, NiCo, Ni/Pt, or NiFe, and n is from 2 to 30. In another aspect, CoFe or CoFeR may replace Co in the laminated stack and R is one of Mo, Mg, Ta, W, or Cr. The smooth template layer formed on the top surface of the non-crystalline or nano-crystalline layer is advantageously used to maintain PMA in the reference layer after high temperature processing up to about 400° C. In alternative embodiments, seed layer stack 25-1 or 25-2 is substituted for stack 24.

In other embodiments, the reference layer 26 may have a SyAP configuration represented by RL1/DL1/Ru/DL2/RL2 as disclosed in related U.S. Pat. No. 8,871,365. In the present disclosure, R1 corresponds to the AP2 layer and R2 is the AP1 layer described above that are antiferromagnetically coupled through the Ru layer.

There may be a transition layer (not shown) such as CoFe/Co or CoFeB/Co formed between the uppermost laminated layer in a (Co/X)$_n$ stack and the tunnel barrier 27. According to one embodiment, the transition layer is formed between the (111) AP1 layer and a (100) MgO tunnel barrier, and is sufficiently thin to preserve the PMA property of the AP1 layer and yet thick enough to provide a high magnetoresistance (MR ratio). Co is preferably used as the uppermost layer in a transition layer and forms an interface with the tunnel barrier layer since it is more resistant to oxidation than a CoFeB or CoFe layer. The transition layer, when present, is considered part of the reference layer 26 because of the magnetic character in the CoFe/Co and CoFeB/Co layers.

A tunnel barrier 27 is formed on the reference layer 26. The tunnel barrier is preferably an oxide, nitride, or oxynitride of one or more of Mg, MgZn, Ta, Ti, Zn, Al, or AlTi. The thickness and extent of oxidation in the metal oxide layer may be adjusted to tune the resistance×area (RA) value for the tunnel barrier. It is believed that the smoothness of the template layer top surface 23t is substantially duplicated in the overlying layers in MTJ 1 including the tunnel barrier.

A free layer/capping layer stack is formed on the tunnel barrier. The free layer 28 may be selected from one of the laminated compositions described with respect to the reference layer. In an alternative embodiment, the free layer may be one or more of Co, Fe, CoFe, and alloys thereof with one or both of Ni and B. In another aspect, a moment diluting layer (L) such as Ta or Mg is inserted in one of the aforementioned metals or alloys to give a CoFeB/L/CoFeB configuration, for example. Furthermore, the free layer (FL) may have a FL1/DL1/Ru/DL2/FL2 configuration where FL1 and FL2 are two magnetic layers or a laminate with PMA as previously described that are antiferromagnetically coupled through a middle Ru layer. DL1 and DL2 are dusting layers as explained earlier.

In some embodiments, the capping layer 29 is a metal oxide such as MgO or MgTaOx to enhance PMA in the free layer by inducing interfacial perpendicular anisotropy along an interface with the free layer. In other embodiments, the capping layer has an uppermost layer that is one or more of Ru and Ta to give a capping layer stack that is Ru/Ta/Ru or MgO/Ru/Ta, for example.

Figure 5:
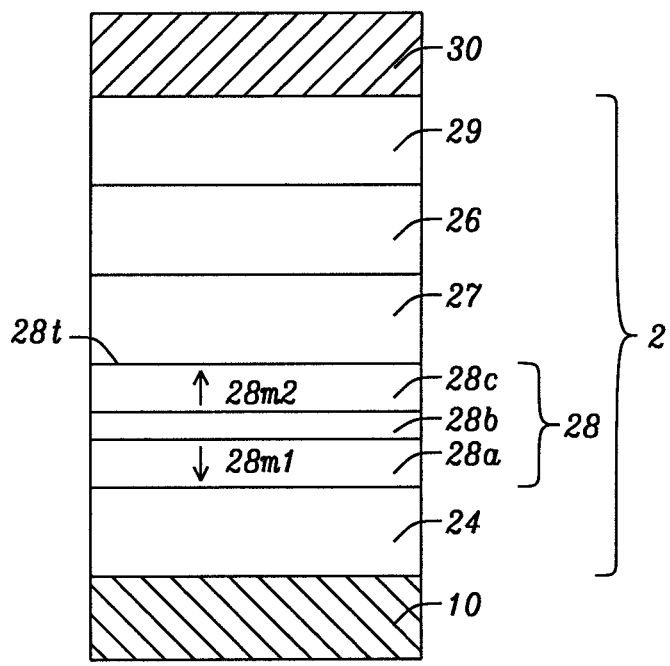
FIG. 5 is a cross-sectional view of a MTJ with a top spin valve configuration and a seed layer stack formed according to an embodiment of the present disclosure.

Referring to FIG. 5, a top spin valve embodiment shown as MTJ 2 is formed according to the present disclosure. Seed layer 24 (or 25-1 or 25-2) is formed on the substrate 10 and then free layer 28, tunnel barrier 27, reference layer 26, and capping layer 29 are sequentially laid down on the free layer. When the reference layer has a SyAP configuration, the AP1 layer 26c contacts the tunnel barrier and AP2 layer 26a is the uppermost layer in the reference layer stack. The free layer contacts the top surface 23t of the template layer in the seed layer stack and has a smooth top surface wherein the peak to peak thickness variation value associated with top surface 23t is believed to be substantially reproduced in the top surface 28t of the free layer. The free layer may comprise two magnetic layers FL1 28a and FL2 28c that are antiferromagnetically coupled through layer 28b that is preferably Ru. As a result, magnetization 28m1 and 28m2 in the FL1 and FL2 layers, respectively, are perpendicular to the plane of the layers and aligned in opposite directions. Each of FL1 and FL2 may be a (Co/X)$_n$ laminate as described earlier with respect to the reference layer, or one or both of FL1, FL2 may be one or more of Co, Fe, CoFe, and alloys thereof with one or both of Ni and B. Furthermore, the free layer may have a FL1/DL1/Ru/DL2/FL2 configuration.

Figure 6:
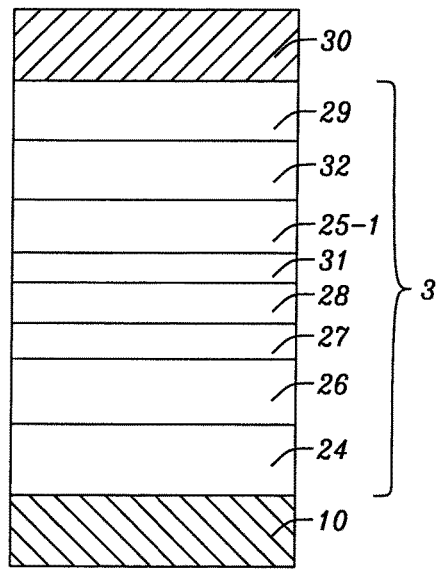
FIG. 6 is a cross-sectional view of a MTJ with a bottom spin valve configuration and including a dipole layer according to an embodiment of the present disclosure.

In another bottom spin valve embodiment illustrated in FIG. 6, MTJ 1 is modified to give MTJ 3 by inserting a second seed layer stack 25-1 and a PMA layer that serves as a dipole layer 32 between the free layer 28 and capping layer 29. Thus, the MTJ has a first seed layer (SL1) stack 24 (or 25-1 or 25-2) contacting a top surface of the substrate 10, and the second seed layer (SL2) stack contacting a top surface of a spacer 31 in a SL1/RL/tunnel barrier/FL/spacer/SL2/dipole layer/capping layer configuration. The spacer is a non-magnetic material including but not limited to one of Ta and Mg that getters oxygen from the free layer. The second seed layer stack that optionally is layer 24 or 25-2 is employed as an underlayer for the PMA layer to maintain the PMA therein after high temperature processing. The dipole layer is preferably a $(Co/X)_n$ laminate with a composition that is one of the multilayers previously described with respect to layer 26 in MTJ 1.

The present disclosure also encompasses a method of forming the seed layer stack in the embodiments disclosed herein. All layers in the MTJ stack including the seed layers may be deposited in a DC sputtering chamber of a sputtering system such as an Anelva C-7100 sputter deposition system or the like that includes ultra high vacuum DC magnetron sputter chambers with multiple targets and at least one oxidation chamber. Typically, the sputter deposition process for the seed layer stack including the high resputtering rate layer 21 and low resputtering rate layer 22 involves an inert gas such as Ar and a base pressure between $5 \times 10^{-8}$ and $5 \times 10^{-9}$ torr. A lower pressure enables more uniform films to be deposited. The temperature in the sputter deposition chamber during deposition processes may vary from 100° K to 400° C., and the forward power applied to one or more targets to form each seed layer is usually in the range of 20 W to 5000 W.

The tunnel barrier and metal oxide (when included) for the capping layer are prepared by first depositing a first metal layer, oxidizing the first metal layer with a natural oxidation (NOX) or radical oxidation (ROX) process, and then depositing a second metal layer on the oxidized first metal layer. During a subsequent annealing step, oxygen migrates into the second metal layer to oxidize the second metal. In some embodiments, one or more additional metal layers are deposited in the tunnel barrier stack and each oxidized by a NOX or ROX process before an uppermost metal layer is deposited and then oxidized by way of annealing to generate tunnel barrier 27.

Once all of the layers in the MTJ are formed, an annealing process is performed that is comprised of a temperature between 330° C. and 400° C. for a period of 1 minute to 10 hours. Thereafter, the spin valve stack may be patterned to form a plurality of MTJ elements on the substrate 10 by a well known photolithography and etch sequence. In an embodiment where the substrate is a bottom electrode, the bottom electrode in some cases is patterned simultaneously with the overlying spin valve stack to enable a higher density of patterned structures for advanced technology designs.

Example 1

Figure 8:
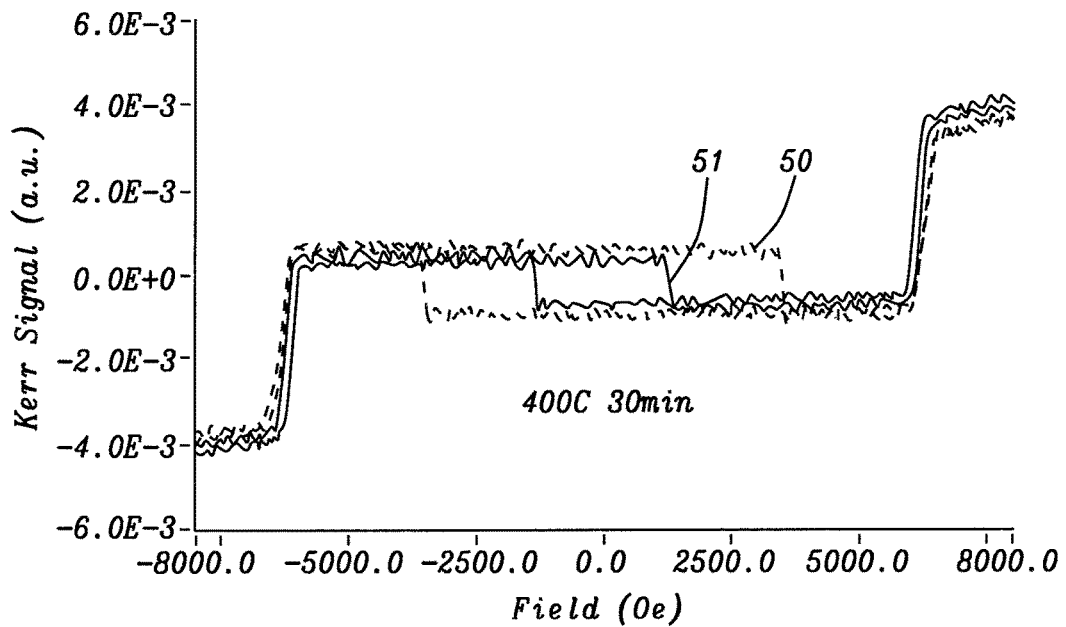
FIG. 8 is a plot of Kerr signal vs. PMA field for a conventional seed layer/reference layer stack, and for a seed layer stack/reference layer of the present disclosure after a 400° C., 30 minute anneal.

To demonstrate the advantages of the present disclosure, a $(Co/Ni)_n$ multilayer stack with PMA where n=3 was fabricated on two different seed layers. The seed layer in the reference sample, which represents the FIG. 1 structure, has a TaN20/NiCr50 stack formed on a first wafer where the TaN thickness is 20 Angstroms and the NiCr thickness is 50 Angstroms. A second seed layer taken from the FIG. 2 embodiment has a TaN20/Mg7/CoFeB10/NiCr50 stack formed on a second wafer where Mg (7 Angstroms thick) is the high resputtering rate layer 21 and CoFeB (10 Angstroms thick) is the amorphous layer 22. Each wafer was annealed at 400° C. for 30 minutes and a Kerr microscope was used to measure a Kerr signal vs perpendicular field as illustrated in FIG. 8 where curve 50 is the signal from the reference wafer, and curve 51 is obtained from the wafer with the seed layer stack formed according to the first embodiment depicted in FIG. 2. The curves show PMA intensities that are essentially the same.

Figure 9:
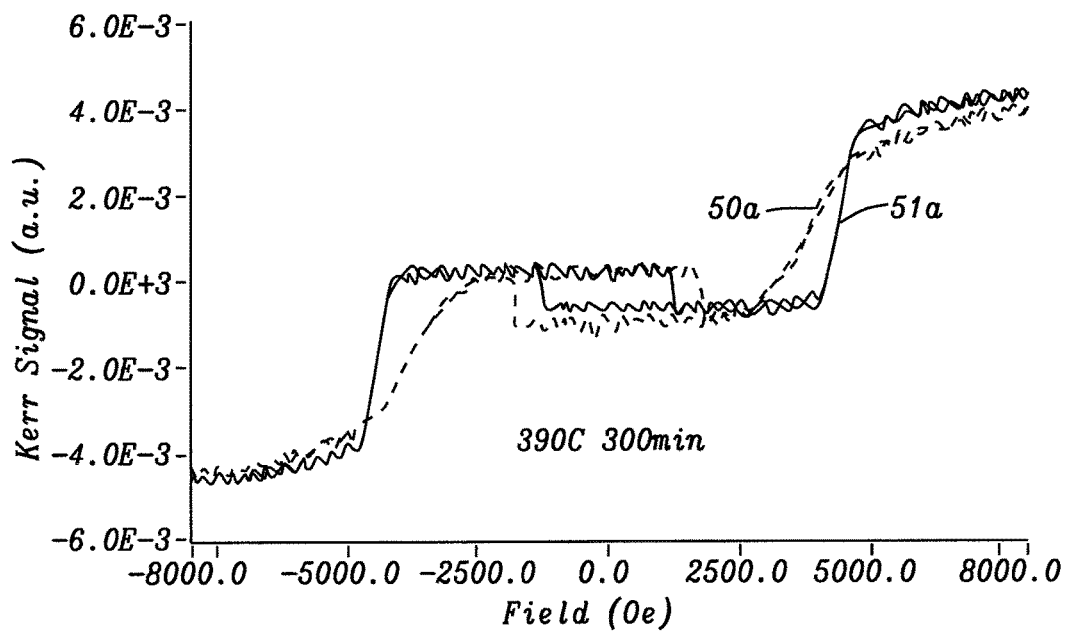
FIG. 9 is a plot of Kerr signal vs PMA field for the samples in FIG. 7 after an additional anneal of 390° C. for 300 minutes.

Thereafter, the wafers were annealed at 390° C. for 300 minutes and a second plot of Kerr signal vs. perpendicular field was obtained as shown in FIG. 9. There is only a slight degradation in PMA compared with the first Kerr measurement for the FIG. 2 embodiment according to curve 51a. However, the reference sample exhibits significant PMA degradation as a result of the second anneal step as indicated by curve 50a. Thus, the seed layer stack of the present disclosure is beneficial in substantially maintaining PMA in an overlying magnetic layer during prolonged heating at about 400° C. while the reference sample fails to maintain a substantial PMA during the same annealing period.

Example 2

In a second experiment that demonstrates the benefit of reduced peak to peak roughness in a template layer top surface provided by a seed layer stack of the present disclosure, a seed layer stack with a TaN20/Mg7/NiCr50 configuration previously fabricated by the inventors, and where the number following each layer is the thickness in Angstroms, was formed on a substrate. For comparison, a laminated smoothing layer having a 21a/22a/21b/22b stack according to the third embodiment was deposited and the TaN/Mg/NiCr seed layer stack deposited thereon to give a Mg25/CoFeB20/Mg50/CoFeB20/TaN20/Mg7/NiCr50 configuration. Each seed layer stack was evaluated by using a TEM to determine a peak to peak roughness of the uppermost NiCr layer top surface. We found the peak to peak roughness of 2 nm for the TaN/Mg/NiCr stack was significantly decreased to only 0.5 nm for the seed layer stack with the laminated smoothing layer. Therefore, a smoother template layer top surface is achieved by inserting a smoothing layer in the seed layer stack and is believed to be responsible for the advantage of substantially maintaining PMA in an overlying magnetic layer after high temperature processing such as annealing to about 400° C. for an extended period of time, typically 1 minute to 10 hours.

The seed layer stack of the embodiments described herein is formed by employing conventional processes and materials without any significant added cost and can readily be implemented in a manufacturing environment.

While this disclosure has been particularly shown and described with reference to, the preferred embodiment thereof, it will be understood by those skilled in the art that various changes in form and details may be made without departing from the spirit and scope of this disclosure.

We claim:
1. A magnetic tunnel junction (MTJ), comprising a first seed layer (SL1) stack, comprising:
   (1) a buffer layer formed on a substrate;
   (2) a first smoothing layer formed on the buffer layer, the first smoothing layer comprises a lower first layer with a first resputtering rate, and an upper second layer that is non-crystalline or nano-crystalline and has a second resputtering rate wherein the first resputtering rate is about 2 to 30 times greater than the second resputtering rate; and (3) a first template layer formed on a top surface of the upper second layer and with a top surface having a peak to peak roughness of about 0.5 nm, the first template layer has a (111) crystal orientation.

2. The MTJ of claim 1 wherein the buffer layer claim is one of Ta or TaN.

3. The MTJ of claim 1 wherein the first template layer is one of NiCr and NiFeCr.

4. The MTJ of claim 1 further comprising:
(a) a reference layer (RL) formed on the first template layer;
(b) a tunnel barrier layer formed on the RL;
(c) a free layer (FL) on the tunnel barrier layer;
(d) a non-magnetic spacer formed on the FL;
(e) a second seed layer stack (SL2) on the non-magnetic spacer, comprising:
(1) a second smoothing layer formed on the non-magnetic spacer, the second smoothing layer comprises a lower third layer with a third resputtering rate, and an upper fourth layer that is non-crystalline or nano-crystalline and has a fourth resputtering rate wherein the third resputtering rate is about 2 to 30 times greater than the fourth resputtering rate; and
(2) a second template layer formed on a top surface of the upper fourth layer and with a top surface having a peak to peak roughness of about 0.5 nm;
(f) a dipole layer formed on the second template layer; and
(g) an uppermost capping layer.

5. The MTJ of claim 4 wherein each of the lower first layer and lower third layer is one or more of Mg, Al, Si, C, B, Mn, Rb, Zn, and Ti.

6. The MTJ of claim 4 wherein each of the upper second layer and upper fourth layer is one of TaN, SiN, and a CoFeM alloy wherein M is one of B, P, Ta, Zr, Si, Cu, Hf, Mo, W, and Nb with a content which makes the CoFeM alloy amorphous as deposited.

7. The MTJ of claim 4, wherein the non-magnetic spacer is Ta or Mg.

8. The MTJ of claim 4, wherein the dipole layer has a $(Co/X)_n$ or $(CoFe/X)_n$ composition, where X is Pt, Pd, Ni, NiCo, Ni/Pt, or NiFe, and n is from 2 to 30.

* * * * *